United States Patent
Hudz et al.

(10) Patent No.: US 6,889,853 B2
(45) Date of Patent: May 10, 2005

(54) EARTHQUAKE-RESISTANT EQUIPMENT RACK

(75) Inventors: Andrew Hudz, Etobicoke (CA); Irena Borojevic, Toronto (CA); Anthony C. Sharp, Scarborough (CA)

(73) Assignee: Sanmina Enclosure Systems Division (CA)

( * ) Notice: Subject to any disclaimer, the term of this patent is extended or adjusted under 35 U.S.C. 154(b) by 0 days.

(21) Appl. No.: 10/027,079

(22) Filed: Dec. 20, 2001

(65) Prior Publication Data

US 2003/0116513 A1 Jun. 26, 2003

(51) Int. Cl.⁷ ............................................. A47F 7/00
(52) U.S. Cl. ......................................................... 211/26
(58) Field of Search ................ 211/26, 189; 312/265.1, 312/265.2, 265.3, 265.4, 205; 361/727, 829, 683, 826, 801, 256, 759, 796

(56) References Cited

U.S. PATENT DOCUMENTS

| | | | |
|---|---|---|---|
| 4,899,892 A | | 2/1990 | Rheault |
| 5,004,107 A | | 4/1991 | Sevier et al. |
| 5,275,296 A | * | 1/1994 | Zachrai ........................ 211/26 |
| 5,284,254 A | | 2/1994 | Rinderer |
| 5,323,916 A | * | 6/1994 | Salmon ........................ 211/26 |
| 5,683,001 A | * | 11/1997 | Masuda et al. ................ 211/26 |
| 5,819,956 A | * | 10/1998 | Rinderer ....................... 211/26 |
| 5,975,315 A | * | 11/1999 | Jordan ........................... 211/26 |
| 5,983,590 A | | 11/1999 | Serban |
| 6,006,925 A | | 12/1999 | Sevier |
| 6,102,214 A | * | 8/2000 | Mendoza ..................... 211/26 |
| 6,179,133 B1 | | 1/2001 | Reece |
| 6,240,687 B1 | * | 6/2001 | Chong ......................... 52/238.1 |
| 6,279,756 B1 | * | 8/2001 | Walter et al. ................. 211/26 |
| 6,321,917 B1 | * | 11/2001 | Mendoza ..................... 211/26 |
| 6,338,413 B1 | * | 1/2002 | Walter et al. ................. 211/26 |
| 6,349,837 B1 | * | 2/2002 | Serban ......................... 211/26 |
| 6,467,633 B1 | * | 10/2002 | Mendoza ..................... 211/26 |

OTHER PUBLICATIONS

Web page http://www.newtoninst.com/symrack.htm, Oct. 26, 2001; 1 page.
Technical Specifications for "Newton Seismic Symmetric Equipment Rack", 3 pages.

* cited by examiner

Primary Examiner—Leslie A. Braun
Assistant Examiner—Khoa Tran
(74) Attorney, Agent, or Firm—McDermott Will & Emery LLP

(57) ABSTRACT

An earthquake-resistant rack for electrical equipment including a base having access apertures for receiving wires and cable therethrough and mounting apertures for securing the base to a floor upon which the rack is mounted. The rack also includes a pair of vertically extending upright members have lower ends secured to opposite sides of the base, and each upright member has a web, opposing first and second flanges projecting from the web, and openings for mounting electrical equipment thereon, and a cross member extends between upper ends of the upright members. Moreover, the base includes a bottom plate, side channels extending at an angle between the bottom plate and the webs of the upright members, and a central channel extending horizontally between the side channels. The channels provide additional strength and stiffness to the rack, without adding substantial weight to the rack.

44 Claims, 2 Drawing Sheets

EARTHQUAKE-RESISTANT EQUIPMENT RACK

FIELD OF THE INVENTION

The subject invention relates to racks for electronic equipment and, more specifically, to an earthquake-resistant telecommunications equipment rack.

BACKGROUND OF THE INVENTION

A common use of equipment racks of the type to which the present invention relates is for carrying telephone circuitry in a building. In general, such racks include a base, side members extending upwardly from the base, and an upper horizontal cross member connecting top ends of the side members. Equipment is mounted between the side members and wire and cable connected to the equipment is supported by the rack. Typically, each rack carries up to 400–500 pounds of equipment, and is bolted or otherwise secured to the floor.

Preservation of electronic equipment during earthquakes and aftershocks for the maintenance of communications and other purposes is a major concern of earthquake preparedness. In fact, alleviation of damage and suffering could depend on the maintenance of the telephone system and broadcast facilities. Moreover, the introduction of electronic and fiber optic telephone switching equipment has significantly increased the density of calls being handled in a single equipment rack or network bay such that thousands of telephone lines can be interrupted with the loss of one bay of equipment. This has made the reliability of telephone switch equipment and its supporting structure critically important, especially with respect to earthquake resistance. Racks of this type, therefore, are required to meet minimum standards for earthquake resistance, such as the BELLCORE Zone 4 seismic test set forth in Document #GR-63-CORE.

It is possible to make an equipment rack that is strong enough to avoid earthquake damage by using heavier material and more bracing members, but this adds significantly to the cost. Heavier material and more bracing, therefore, are not a solution acceptable in the competitive environment of modern telephone systems. In addition, it has been found that lighter weight, yet more rigid equipment racks behave more favorably during shaking of the type encountered during earthquakes.

During seismic motion the base of a tall, slender rack moves with the floor to which it is anchored. If the rack is sufficiently rigid and well anchored it will closely follow the motions of the base and floor. If, however, the rack is more flexible, it will move at a rate different to that of the base and floor, and consequently experience high stresses and deflections. Free-standing electronic equipment racks typically have low natural resonance frequencies in the range from 1 to 10 Hz. In earthquakes, the highest energy dissipation occurs in the 4 to 5 Hz region, thereby making the racks vulnerable to earthquake induced damage. Increasing the natural frequency of the racks above the 4 to 5 Hz range, therefore, has been found to improve the earthquake resistance of equipment racks. One way to increase the natural frequency of an equipment rack is to increase its rigidity without increasing its weight.

What is still desired is a new and improved telecommunications equipment rack that is earthquake resistant. Preferable, the improved rack will include increased structural rigidity without a substantial increase in weight.

SUMMARY OF THE INVENTION

In response, the present invention provides a new and improved rack for electrical equipment including a base having access apertures for receiving wires and cable therethrough and mounting apertures for securing the base to a floor upon which the rack is mounted. The rack also includes a pair of vertically extending upright members which have lower ends secured to opposite sides of the base. Each upright member also has a web, opposing first and second flanges projecting from the web, and openings for mounting electrical equipment thereon. The rack additionally has a cross member extending between upper ends of the upright members. Moreover, the base includes a bottom plate, side channels extending at an angle between the bottom plate and the webs of the upright members, and a central channel extending horizontally between the side channels. The channels provide additional strength and stiffness to the rack, without adding substantial weight to the rack.

According to one aspect of the present invention, at least a portion of one of the flanges of the upright members tapers towards the web from the lower ends of the upright members, which also provide additional strength and stiffness to the rack, without adding substantial weight to the rack.

According to another aspect, at least one brace is secured to the cross-member, extends through the web of each upright member, and is secured to one of the flanges of each upright member to provide additional strength and stiffness to the rack without adding substantial weight to the rack.

According to a further aspect, separate flange reinforcing plates are secured flat against interior surfaces of the flanges of the upright members and extend vertically from the lower ends of the upright members. The reinforcing plates also provide additional strength and stiffness to the rack without adding substantial weight to the rack.

The foregoing and other features, aspects and advantages of the present invention will become more apparent from the following detailed description of the present invention when taken in conjunction with the accompanying drawings.

BRIEF DESCRIPTION OF THE DRAWINGS

Like reference characters designate identical or corresponding components and units between the two embodiments of the present invention.

DETAILED DESCRIPTION OF THE INVENTION

Figure 1:
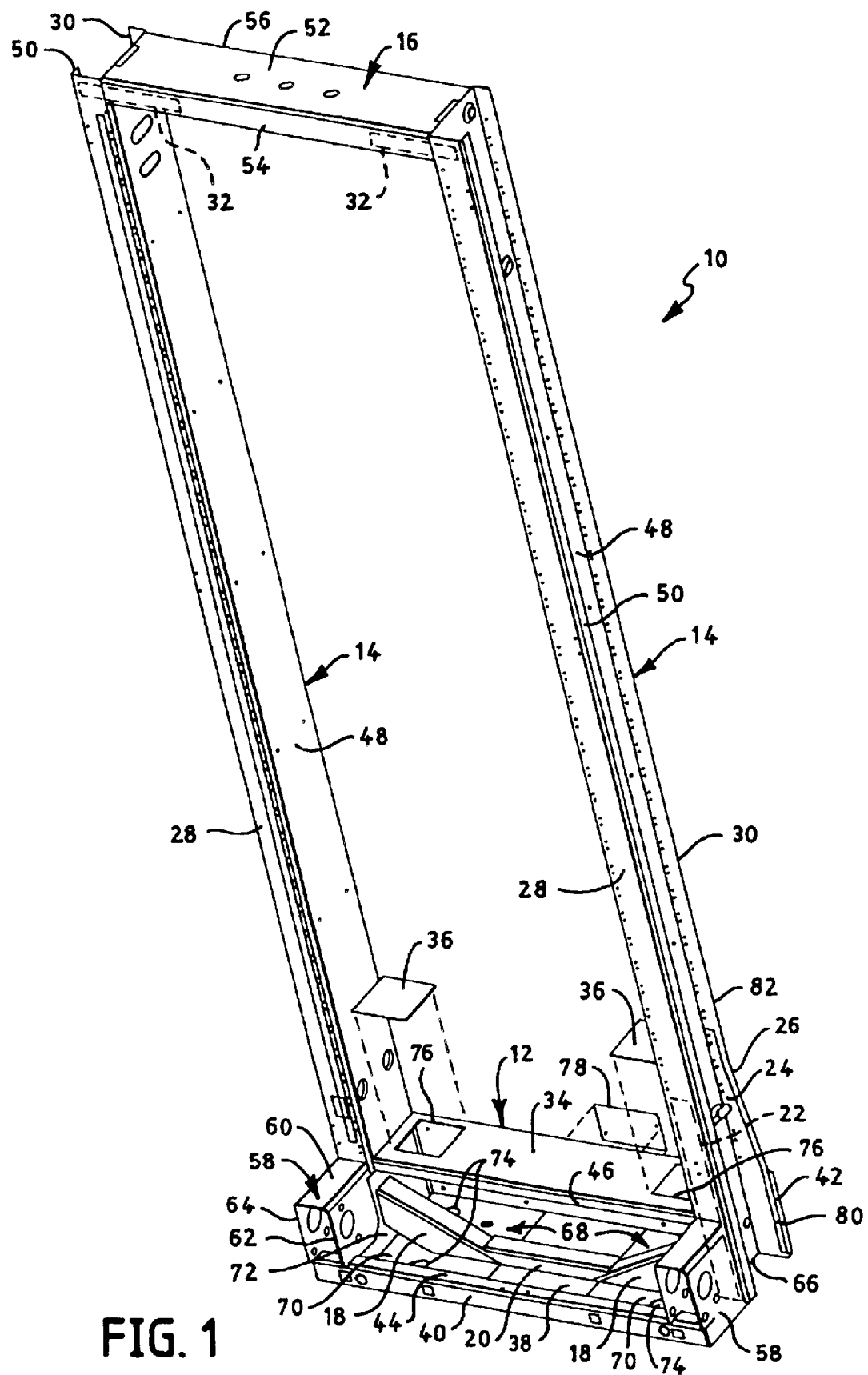
FIG. 1 is a perspective view of an electronic equipment rack braced against earthquake damage in accordance with the present invention.

Referring to FIG. 1, the present invention provides a new and improved electronic equipment rack 10 including features that provide the rack with exceptional strength and rigidity without substantially increasing the weight and cost of the rack 10. The rack 10 generally includes a base 12, upright members 14 extending vertically from the base 12, and a cross member 16 extending horizontally between the upright members 14. The improvements to the rack 10 include channel pieces 18, 20 reinforcing the base 12, flange stiffener plates 22, 24 secured to the upright members 14, tapered portions 26 on flanges 30 of the upright members 14, braces 32 strengthening the connection between the cross member 16 and the upright members 14, and a top wall 34 of the base 12 permanently secured between the upright members 14 but having removable access panels 36. These new and improved features help strengthen the rack 10 against earthquake damage without substantially increasing the weight or cost of the rack 10.

The base 12 includes a bottom plate 38, opposing first and second end walls 40, 42 extending upward from the bottom plate, and the top wall 34 extending forward from the second end wall 42 and parallel with the bottom plate 38. A first stiffening flange 46 extends downward from a front edge of the top wall 34 and parallel with the second end wall 42, and a second stiffening flange 44 extends rearward from a top edge of the first end wall 40 and parallel with the bottom plate 38.

Still referring to FIG. 1, the upright members 14 are secured to opposing ends of the bottom plate 38, the second end wall 42 and the top wall 34 of the base 12. Each upright member 14 includes a vertically extending web 48 and parallel first and second flanges 28, 30 extending outwardly from the web 48. The first flanges 28 include lips 50 extending towards the second flanges 30 and parallel with the webs 48. The cross member 16 includes a horizontally extending web 52 and parallel first and second flanges 54, 56 extending downward from the web.

The base 12 also includes channel-like gussets 58 secured to the bottom plate 38 and extending between the first flanges 28 of the upright members 14 and the first end wall 40 of the base 12. Each gusset 58 includes a horizontal portion 60, and inner and outer legs 62, 64 depending downwardly therefrom and disposed in contact with the bottom plate 38. The bottom plate 38 includes cut-outs 66 to accommodate the upright members 14 adjacent to gussets 58, such that lower ends of the upright members 14 are unobstructed.

In order to increase the strength and the stiffness of the rack 10 without significantly increasing the weight of the rack 10, angle inserts 68 having horizontal and vertical portions 70, 72 are provided in the base 12. The inserts 68 are positioned such that the horizontal portions 70 contact the bottom plate 38 and the vertical portions 72 contact both the inner legs 62 of the gussets 58 and an inwardly facing surface of the webs 48 of the upright members 14. The base 12 includes mounting opening 74 extending through the angle inserts 68 and the bottom plate 38 for receiving bolts for securing the equipment rack 10 to a floor. The top wall 34 of the base 12 includes access openings 76 positioned over the mounting openings 74 for allowing tool access for bolting the base 12 to a floor. The removable access panels 36 are secured to the top wall 34 with screws, for example, for closing the access openings 76. Although not viewable in FIG. 1, the second end wall 42 of the base 12 includes an opening for mounting a wire connector, for example, and a removable panel 78 secured to the end wall for closing the opening.

The base 12 also includes the channel pieces 18, 20. Two of the channel pieces are "side" channel pieces 18 that extend at an angle, while one of the channel pieces is a "central" channel piece 20 that extends horizontally. Each of the side channel pieces 18, 20 extends at an angle between the horizontal and vertical portions of the angle inserts. As shown in FIG. 1, the side channel pieces 18 are aligned with the joint between the gussets 58 and the upright members 14. The central channel piece 20 extends horizontally between inwardly facing edges of the horizontal portions 70 of the angle inserts 68 and between the two side channel pieces 18. Each of the three channel pieces 18, 20 are inverted.

The upright members 14 are each provided with two of the separate flange stiffener plates 22, 24, which are secured flat against interior surfaces of the flanges 28, 30 of the upright members 14 (in FIG. 1 only the flange stiffener plates 22, 24 of one of the upright members 14 are viewable, but the plates of both upright members 14 are identical). The flange stiffener plates 22, 24 extend vertically from the lower ends of the upright members 14 to a height above the second end wall 42 and the gussets 58 of the base 12. Each pair of the flange stiffener plates 22, 24 are separate and not connect as a unitary piece, through a web for example. Preferably, the reinforcing plates 22, 24 extend upward to about one-fifth the overall height of the upright members 14.

The second flanges 30 of the upright members 14 are provided with the tapering portions 26. The second flanges 30 include lower portions 80 extending from the lower end of the upright members 14 to the tapering portions 26, and upper portions 82 that extend from the tapering portions to upper ends of the upright members 14. As shown in FIG. 1, the lower portions 80 extend outwardly further than the upper portions 82, and the tapering portions 26 taper inwardly from the lower portions to the upper portions. The larger lower portions 80 and tapering portions 26 provide additional stiffness and strength without enlarging the second flanges 30 along their entire length.

The braces 32 strengthening the connection between the cross member 16 and the upper ends of the upright members 14 extend horizontally against an interior surface of the first flange 54 of the cross member 16. Ends of the braces 32 extend through the webs 48 of the upright members 14 and are secured against the interior surfaces of the first flanges 28 of the upright members 14. The braces 32 provide additional stiffness and strength to the rack 10 without significantly increasing the overall weight of the rack 10. Preferably, the rack 10 includes two braces 32, as shown, and each brace 32 has a length equal to at least one quarter (25%) the length of the cross member 16. Alternatively, the rack 10 can be provided with a single long brace extending between the upright members 14 and secured to the cross member 16. However, the two short braces 32 are preferred for providing increased strength and stiffness at less weight.

Preferably, the equipment rack 10 is constructed of high-tensile, low-alloy steel. In addition, all joints between the various parts of the rack 10 are preferably made by welding. The base 12 and the upright members 14 include various wire and cable access apertures, and the upright members 14 additionally include apertures of various sizes and locations to which equipment may be mounted directly or to which shelving may be mounted. While no specific electronic equipment has been shown in the drawings, it is clear that the rack 10 according to the subject invention can be used in the usual manner to support telephonic, broadcasting, and other electronic equipment.

The rack 10 of the present invention is intended to meet minimum standards for earthquake resistance, such as the BELLCORE Zone 4 seismic test set forth in Document #GR-63-CORE.

Figure 2:
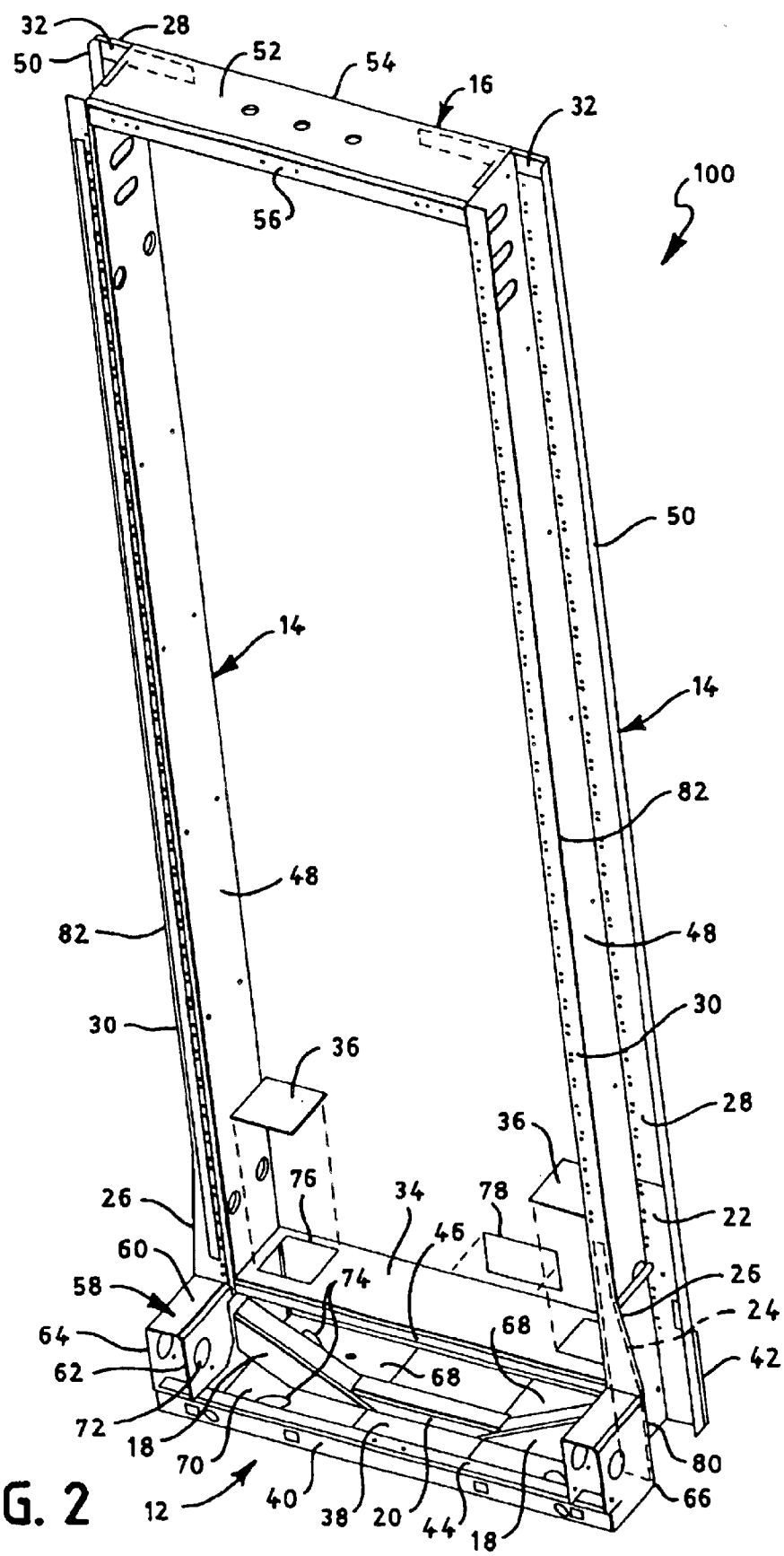
FIG. 2 is a perspective view of another electronic equipment rack braced against earthquake damage in accordance with the present invention.

FIG. 2 shows another embodiment of an equipment rack 100 constructed in accordance with the present invention. The rack 100 of FIG. 2 is similar to the rack 10 of FIG. 1 such that the same elements have the same reference numbers. In the rack 100 of FIG. 2, however, the upright members 14 are reversed such that the second flanges 30 are in contact with the gussets 58 and the first flanges 28 are in contact with the second end wall 42 of the base 12.

Although the present inventions have been described and illustrated in detail, it is to be clearly understood that the same is by way of illustration and example only and is not to be taken by way of limitation, the scope of the present invention being limited only by the terms of the appended claims.

What is claimed is:

1. A rack for electrical equipment comprising:
   a base including a bottom plate having access apertures for receiving wires therethrough and mounting apertures for securing the base to a floor upon which the rack is mounted;
   a pair of vertically extending upright members having lower ends secured to opposite sides of the base, each upright member having a web, opposing first and second flanges projecting from the web, and openings for mounting electrical equipment thereon;
   a cross member extending between upper ends of the upright members; and
   wherein the second flanges of the upright members each includes a lower portion extending upwardly from the lower end of the upright member, an upper portion extending downwardly from the upper end of the upright member, and a tapered portion tapering towards the web between the lower and the upper portions and the base includes cut-outs accommodating the upright members, and
   wherein the base comprises gussets secured to the bottom plate and extending from the first flanges of the upright members, and angle inserts including vertical plates positioned parallel to and against the upright members and the gussets and horizontal plates positioned parallel to and against the bottom plate, and
   wherein said base further comprises at least two side channel pieces extending at an angle between said horizontal plates of said angle inserts and said vertical plates of said angle inserts, each side channel piece having two ends being respectively affixed to said horizontal plates and said vertical plates, and a central channel piece extending horizontally between the side channel pieces and the angle inserts, said central channel piece affixed to the bottom plate of the base and having two opposite ends affixed to two opposing ends of said at least two side channel pieces and edges of the horizontal plates of the angle inserts.

2. A rack as set forth in claim 1, further comprising reinforcing plates secured flat against interior surfaces of the tapered portions of the second flanges of the upright members.

3. A rack as set forth in claim 1, wherein each of the upright members further comprises a lip extending opposite the web from one of the first and the second flanges.

4. A rack as set forth in claim 1, further comprising at least one brace secured to the cross-member and extending through the web of each upright member, and secured to one of the flanges of each upright member.

5. A rack as set forth in claim 4, wherein the cross member comprises a web and first and second flanges extending downwardly from the web of the cross member, and wherein the at least one brace is secured to interior surfaces of the first flanges of the cross member and the upright members.

6. A rack as set forth in claim 1, wherein the base comprises an end wall extending upwardly from the bottom plate, and a top wall extending horizontally from the end wall above the bottom plate.

7. A rack as set forth in claim 6, wherein the end wall having two opposite ends which are secured to the second flanges of the upright members.

8. A rack as set forth in claim 6, wherein the mounting apertures of the base are located in the bottom plate, and the top wall includes access openings positioned over the mounting apertures.

9. A rack for electrical equipment comprising:
   a base including a bottom plate having access apertures for receiving wires therethrough and mounting apertures for securing the base to a floor upon which the rack is mounted;
   a pair of vertically extending upright members having lower ends secured to opposite sides of the base, each upright member having a web, opposing first and second flanges projecting from the web, and openings for mounting electrical equipment thereon;
   a cross member extending between upper ends of the upright members; and
   wherein the base comprises gussets secured to the bottom plate and extending from the first flanges of the upright members, and angle inserts including vertical plates positioned parallel to and against the upright members and the gussets and horizontal plates positioned parallel to and against the bottom plate, and
   wherein the base further includes at least two side channel pieces extending at an angle between the horizontal plates of the angle inserts and the vertical plates of the angle inserts, each said channel piece having two ends being respectively affixed to said horizontal plates and said vertical plates, and a central channel piece extending horizontally between the side channel pieces and the angle inserts, said central channel piece affixed to the bottom plate of the base and having two opposite ends affixed to two opposing ends of said at least two side channel pieces and edges of the horizontal plates of the angle inserts.

10. A rack as set forth in claim 9, and further comprising separate flange reinforcing plates secured flat against interior surfaces of the flanges of the upright members and extending vertically from the lower ends of the upright members.

11. A rack as set forth in claim 10, wherein the reinforcing plates are attached to the flanges by welding.

12. A rack as set forth in claim 10, wherein each of the reinforcing plates extends about one-fifth the height of the upright members.

13. A rack as set forth in claim 10, wherein at least a portion of one of flanges of the upright members tapers towards the web from the lower ends of the upright members.

14. A rack as set forth in claim 10, wherein the second flanges of the upright members each includes a lower portion extending upwardly from the lower end of the upright member, an upper portion extending downwardly from the upper end of the upright member, and a tapered portion tapering towards the web between the lower and the upper portions.

15. A rack as set forth in claim 10, wherein each of the upright members further comprises a lip extending opposite the web from one of the first and the second flanges.

16. A rack as set forth in claim 10, further comprising at least one brace secured to the cross-member and extending through the web of each upright member, and secured to one of the flanges of each upright member.

17. A rack as set forth in claim 16, wherein the cross member comprises a web and first and second flanges extending downwardly from the web of the cross member, and wherein the at least one brace is secured to interior surfaces of the first flanges of the cross member and the upright members.

18. A rack as set forth in claim 10, wherein the base comprises an end wall extending upwardly from the bottom plate, and a top wall extending horizontally from the end wall above the bottom plate.

19. A rack as set forth in claim 18, wherein the mounting apertures of the base are located in the bottom plate, and the top wall includes access openings positioned over the mounting apertures.

20. A rack as set forth in claim 18, wherein the bottom plate includes cut-outs accommodating the upright members, such that the lower ends of the upright members are unobstructed.

21. A rack as set forth in claim 10, wherein the second flanges of the upright members each includes a lower portion extending upwardly from the lower end of the upright member, an upper portion extending downwardly from the upper end of the upright member, and a tapered portion tapering towards the web between the lower and the upper portions and the base includes cut-outs accommodating the upright members, such that the lower ends of the upright members are unobstructed.

22. A rack as set forth in claim 21, wherein at least two of the reinforcing plates are secured flat against interior surfaces of the tapered portions of the second flanges of the upright members.

23. A rack as set forth in claim 9, and further comprising at least one brace secured to the cross-member and extending through the web of each upright member, and secured to one of the flanges of each upright member.

24. A rack as set forth in claim 23, wherein the second flanges of the upright members each includes a lower portion extending upwardly from the lower end of the upright member, an upper portion extending downwardly from the upper end of the upright member, and a tapered portion tapering towards the web between the lower and the upper portions and the base includes cut-outs accommodating the upright members, such that the lower ends of the upright members are unobstructed, and the base includes an end wall having two opposite ends which are secured to the second flanges of the upright members.

25. A rack as set forth in claim 24, further comprising reinforcing plates secured flat against interior surfaces of the tapered portions of the second flanges of the upright members.

26. A rack as set forth in claim 23, wherein the at least one brace comprises two braces.

27. A rack as set forth in claim 26, wherein each brace has a length equal to at least one quarter a length of the cross member.

28. A rack as set forth in claim 23, wherein the cross member comprises a web and first and second flanges extending downwardly from the web of the cross member, and wherein the at least one brace is secured to interior surfaces of the first flanges of the cross member and the upright members.

29. A rack as set forth in claim 23, wherein each of the upright members further comprises a lip extending opposite the web from one of the first and the second flanges.

30. A rack as set forth in claim 23, wherein the base comprises an end wall extending upwardly from the bottom plate, and a top wall extending horizontally from the end wall above the bottom plate.

31. A rack as set forth in claim 30, wherein the mounting apertures of the base are located in the bottom plate, and the top wall includes access openings positioned over the mounting apertures.

32. A rack as set forth in claim 30, wherein the bottom plate includes cut-outs accommodating the upright members, such that the lower ends of the upright members are unobstructed.

33. A rack as set forth in claim 9, wherein each of the upright members further comprises a lip extending opposite the web from one of the first and the second flanges.

34. A rack as set forth in claim 9, wherein the base comprises an end wall extending upwardly from the bottom plate, and a top wall extending horizontally from the end wall above the bottom plate.

35. A rack as set forth in claim 34, wherein the mounting apertures of the base are located in the bottom plate, and the top wall includes access openings positioned over the mounting apertures.

36. A rack as set forth in claim 34, wherein the bottom plate includes cut-outs accommodating the upright members, such that the lower ends of the upright members are unobstructed.

37. A rack for electrical equipment comprising:
a base including a bottom plate having access apertures for receiving wires therethrough and mounting apertures for securing the base to a floor upon which the rack is mounted;
a pair of vertically extending upright members having lower ends secured to opposite sides of the base, each upright member having a web, opposing first and second flanges projecting from the web, and openings for mounting electrical equipment thereon, wherein at least a portion of one of the flanges of each of the upright members tapers towards the web from the lower ends of the upright members;
separate flange reinforcing plates secured flat against interior surfaces of the flanges of the upright members and extending vertically from the lower ends of the upright members;
a cross member extending between upper ends of the upright members;
at least one brace secured to the cross-member and extending through the web of each upright member, and secured to one of the flanges of each upright member;
wherein the base comprises gussets secured to the bottom plate and extending from the first flanges of the upright members, and angle inserts including vertical plates positioned parallel to and against the upright members and the gussets and horizontal plates positioned parallel to and against the bottom plate, and
side channel pieces extending at an angle between said horizontal plates of said angle inserts and said vertical plates of said angle inserts, each said channel piece having two ends being respectively affixed to said horizontal plates and said vertical plates; and
a central channel piece extending horizontally between the side channels and the angle inserts, said central channel piece affixed to the bottom plate of the base and having two opposite ends affixed to two opposing ends of said at least two side channel pieces and edges of the horizontal plates of the angle inserts.

38. A rack as set forth in claim 37, wherein the reinforcing plates are attached to the flanges by welding.

39. A rack as set forth in claim 37, wherein each of the reinforcing plates extends about one-fifth the height of the upright members.

40. A rack as set forth in claim 37, wherein the second flanges of the upright members each includes the tapered portion, a lower portion extending upwardly from the lower end of the upright member to the tapered portion, an upper portion extending downwardly from the upper end of the upright member to the tapered portion, and the tapered portion tapers towards the web from the lower portion to the upper portion.

41. A rack as set forth in claim 37, wherein each of the upright members further comprises a lip extending opposite the web from one of the first and the second flanges.

42. A rack as set forth in claim 37, wherein the cross member comprises a web and first and second flanges extending downwardly from the web of the cross member, and wherein the at least one brace is secured to interior surfaces of the first flanges of the cross member and the upright members.

43. A rack as set forth in claim 37, wherein the base comprises a bottom plate, an end wall extending upwardly from the bottom plate and a top wall extending horizontally from the end wall above the bottom plate, wherein the mounting apertures of the base are located in the bottom plate, and the top wall includes access openings positioned over the mounting apertures.

44. A rack as set forth in claim 37, wherein the base includes cut-outs accommodating the upright members, such that the lower ends of the upright members are unobstructed.

* * * * *